United States Patent [19]

Almquist et al.

[11] Patent Number: 4,912,521
[45] Date of Patent: Mar. 27, 1990

[54] ELECTRO-OPTICAL TRANSDUCER ASSEMBLY

[75] Inventors: Frank A. Almquist, Saugerties; Roger Gjone, Lake Katrine; Thor A. Larsen, Woodstock; Roman Hawryluk, Cottekill, all of N.Y.

[73] Assignee: International Business Machines Corporation, Armonk, N.Y.

[21] Appl. No.: 115,466

[22] Filed: Oct. 30, 1987

[51] Int. Cl.⁴ ............................................. H04B 9/00
[52] U.S. Cl. .................................. 455/600; 350/96.11; 455/607; 455/612
[58] Field of Search ............... 455/600, 606, 607, 603, 455/608, 612, 613, 617; 370/1, 4; 250/239; 307/71, 303, 305, 311; 350/96.11, 96.14; 357/30, 81, 74

[56] References Cited

U.S. PATENT DOCUMENTS

4,161,650 7/1979 Caouette et al. ............... 455/612

Primary Examiner—Robert L. Griffin
Assistant Examiner—L. Van Beek
Attorney, Agent, or Firm—Robert L. Troike

[57] ABSTRACT

An electro-optical transducer assembly for translating between an optical high speed serial data transmission path and parallel electrical data transmission paths is provided by a light emitting or light detecting device with serial terminals, a logic chip with timing, amplifying, serializing or de-serializing circuitry, and a multilayer coupling chip with parallel input or output contacts mounted between the device and the logic chip for coupling the serial terminals of the device to the serial terminals on the logic chip and coupling the logic chip parallel terminals to the parallel input or output contacts.

14 Claims, 7 Drawing Sheets

ELECTRO-OPTICAL TRANSDUCER ASSEMBLY

FIELD OF INVENTION

This invention relates to a transducer assembly for high speed data signals and more particularly for converting between high speed serial from an optical source and parallel electrical conductors.

BACKGROUND OF INVENTION

Communications via optical fibers is rapidly replacing conventional hard wire conductors in high data rate applications. These optical fibers operate at the high optical frequencies and are broad band. The bandwidth is broad and therefore the amount of data transmitted is significantly greater than that typically over conventional conductive wires. In order to handle this amount of data it is desirable to convert the serial data to parallel data using a high speed transducer assembly or apparatus. It is desirable that this connecting apparatus not be slowed down by long leads. It is further desirable that the processing circuitry be placed on an integrated circuit logic chip so it is compact, low cost and so again the lead lengths are small. It is further desirable to provide improved heat dissipation of the logic chip which has a small surface area.

SUMMARY OF INVENTION

In accordance with one preferred embodiment of the present invention, a transducer assembly is provided that comprises an optical to electrical transducer and a logic chip including serial to parallel or parallel to serial conversion circuitry with both input and output terminals on one broad surface of the logic chip and a multilayer coupling chip mounted between the transducer and the logic chip. The coupling chip has one broad surface coupled to the transducer and the opposite broad surface coupled to the one broad surface of the logic chip and coupling means for feeding serial signals from the transducer through the thickness of the coupling chip to the serial terminals of the logic chip or vice versa, and coupling means for coupling the parallel terminals of the logic chip to parallel contacts near one edge of said coupling chip whereby both the serial and parallel leads to or from the logic chip are provided via the coupling chip.

Figure 1:
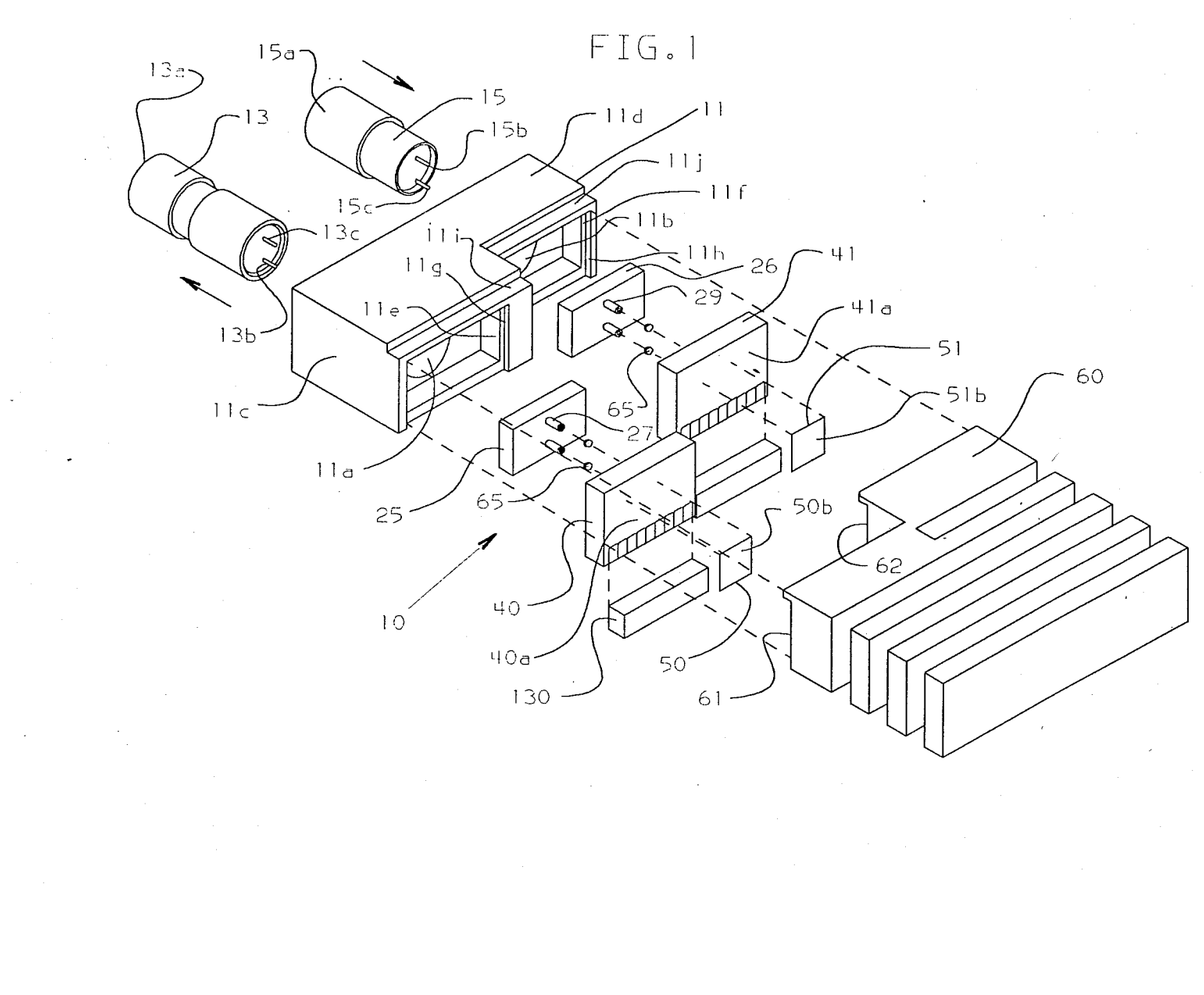
FIG. 1 is a perspective view of the transceiver assembly according to one preferred embodiment of the present invention.

Referring to FIG. 1, there is illustrated the fiber optic hybrid transceiver 10. Transceiver 10 comprises an optical transmitter subassembly 13 and a receiver subassembly 15. The body of the optical transmitter subassembly 13 is cylindrical with one end 13a adapted to be coupled to optical fibers and the opposite end 13b has conductive pins 13c. The optical transmitter subassembly 13 includes a laser or light emitting diode responsive to transmit signals at the pins 13a for transmitting serial optical signals via the optical fibers. The sub-assembly is for example a laser Model No. FU06LD of Mitsubishi Electronics Corporation. The receiver sub-assembly is also cylindrical in shape with one end 15a adapted to receive the optical data from coupled optical fibers and the opposite end 15b having a pair of conductive pins 15c. The receiver includes a photodiode detector and may be, for example, Model No. FU11PD11 of Mitsubishi Electronics Corporation.

The transceiver 10 further includes a front end housing 11 adapted to house both the transmitter subassembly 13 and the receiver subassembly 15. The housing is made of a conductive metal material with an aperture 11a adapted to receive the transmitter subassembly 13 and a second aperture 11b adapted to receive the receiver subassembly 15. Portion 11c of the housing 11 is made substantially longer than portion 11d to completely house the longer transmitter subassembly 13. Likewise the receiver subassembly is housed in shorter portion 11d of the front end housing 11. A common wall 11i divides and isolates the portions 11c and 11d. The housing 11 at the electrical end has recesses 11e and 11f centered with respect to the apertures 11a and 11b respectively. The transmitter subassembly 13 is mounted in the housing so that the pins 13b extend into the recess 11e. Similarly, the receiver subassembly 14 pins 15b extend into recess 11f. The recesses 11e and 11f are adapted to receive therein a rectangular shaped interposer 25 for the transmitter subassembly and a receiver interposer 26 for the receiver subassembly.

The transmitter interposer 25 includes a dielectric block having apertures therethrough and hollow conductive cylindrical pin extenders 27 adapted to fit over the pins 15b located at the transceiver end of the transmitter subassembly. The number of pin extenders 27 equals the number of pins 13b. The pin extenders are of a diameter to fit snuggly over the associated pins to behave as pin sockets. The terminal end of the pin extenders remote from the subassemblies has a solid base. The receiver interposer 26 in recess 11f has a pair of like extenders 29 over pins 15b. The housing further has an outer recesses 11g and 11h which are adapted to receive about one half the depth of multi-layer ceramic coupling chips 40 and 41 to provide alignment of the pins with respect to the coupling chips.

Figure 2:
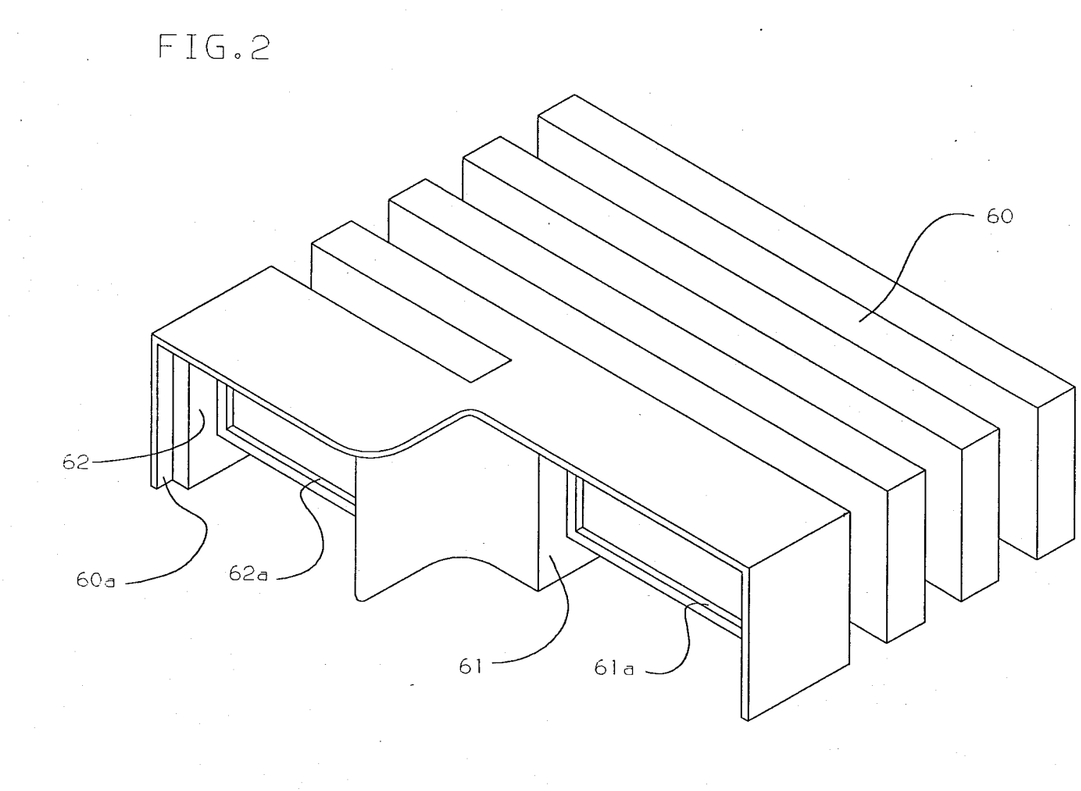
FIG. 2 is a perspective view of the heatsink of FIG. 1.

The multi-layer ceramic coupling chips 40 and 41 which will be described in more detail later are multi-layer ceramic substrates which are fused together and contain different circuit patterns to provide coupling from the pins and pin extenders to the logic circuit to be described and from the logic chip to a pluggable circuit board. The coupling chips may be, for example, cofired multi-layer ceramic structure made by Kyocera Co. 52-11 Inove-cho, Higashino, Yamashina-Ku, Kyoto 607 Japan. Structures like this are described for example, in an article by J. Dorler, et al. entitled "A Ceramic Card Concept" in Proceedings of Electronics Components Conference 1982. The multi-layer ceramic coupling chips 40 and 41 are mounted in the recesses 11g and 11h respectively, which match the rectangular shape of the chips 40 and 41 respectively, to align the chips with respect to the transducers, with the one surface thereof adjacent to the pin extenders 27 and 29, respectively. On the opposite broad surface 40a and 41a of the chips 40 and 41 respectively, there is mounted respectively the integrated circuit logic chips 50 and 51. A heatsink housing 60 adapted to match that of the front housing 11 is mounted to the back surface 50b and 51b of the respective logic chips 50 and 51. Referring to FIG. 2, the heatsink housing 60 has rectangular recesses 61 and 62 for receiving and aligning a portion of the multi-layer ceramic coupling chips 40. The logic chips 50 and 51 fit in recess 61a and 62a. The outer lip 60a fits over recess 11j in FIG. 1, providing a completely enclosed housing except for bottom edge of chips 40 and 41.

The logic chip 50 includes a serializing, amplifying and clock extraction circuitry with all contacts positioned on the surface facing the multi-layer ceramic coupling chip 40. The logic chip is, for example, a high speed bipolar logic chip with C4 interconnector from IBM Corporation, General Technology Division, East Fishkill, New York. Serializing, amplifying and clock extraction circuits are well-known. Another known commercial device is provided by Advanced Micro Devices AM7968 (Transmitter) and AM7969 (Receiver) chipset. This later chipset is described in January 22, 1987, Electronic Design, pp. 79-83. Advanced Micro Devices is located at 90 Thompson Place, Sunnyvale, CA 94088. Referring to FIG. 2 for example, there is illustrated the contacts on the surface 50a or 51a of chip 50 or 51. The logic chip 50 or 51 includes connector pads corresponding in number and position to the contacts on surfaces 40a or 41a of coupling chip 40 or 41. The logic chip 50 provides serializing with a plurality of parallel data inputs to be coupled thereto to provide the smaller plurality of outputs which correspond to the number of transmitter subassembly pins 13b. A pair of these outputs match a pair of transmitter transducer pins for providing the serial data path to the transmitter transducer. A plurality of parallel input contacts on the logic chip are also located on the same surface that faces the multi-layer ceramic coupling chip. Similarly, logic chip 51 includes a deserializing, amplifying and clock recovery circuitry positioned on the surface 51a adjacent the multi-layer ceramic coupling chip 41. The broad surface non-contact end 50b and 51b (see FIG. 1) of logic chips 50 and 51 are adjacent the heatsink 60 for providing heatsinking.

Figure 3:
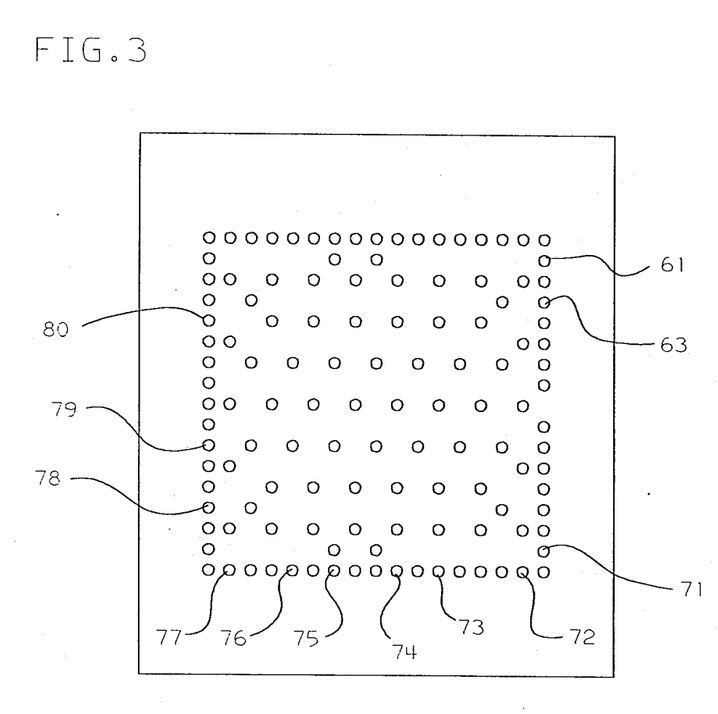
FIG. 3 is a plan view of one broad surface of the logic chip of FIG. 1.

Referring to FIG. 3, the pair of contacts 61 and 63 are the receiver input contacts for the receiver logic chip 51. These contacts receive the serial transmission line data from the pair of pins 15c via the pin extenders 29, wire pads 65 and crossovers in chip 41. Similarly, these same contacts 61 and 63 for chip 50 are the output serial transmission line contacts to the pins 13c of transmitter subassembly 13 via extender 27 buttons 65 and crossover in chip 40. The output contacts 71 through 80 are the parallel output contacts of the logic chip 51. Similarly, these are the parallel signal input contacts for serializing in chip 50. The other unlabeled contacts are provided for voltage test points, signal control circuitry, power supply connections and other monitoring of the logic chip 50 or 51.

Figure 5:
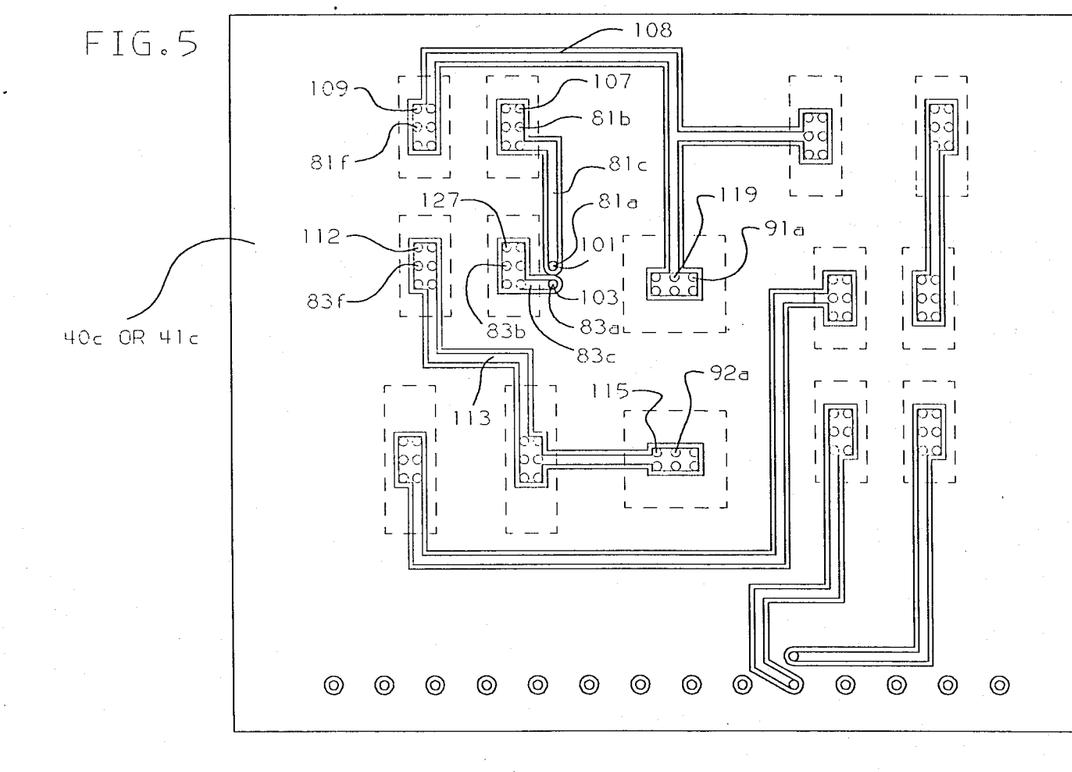
FIG. 5 is a plan view of a first intermediate cross over layer of the coupling chips of FIG. 1.
Figure 6:
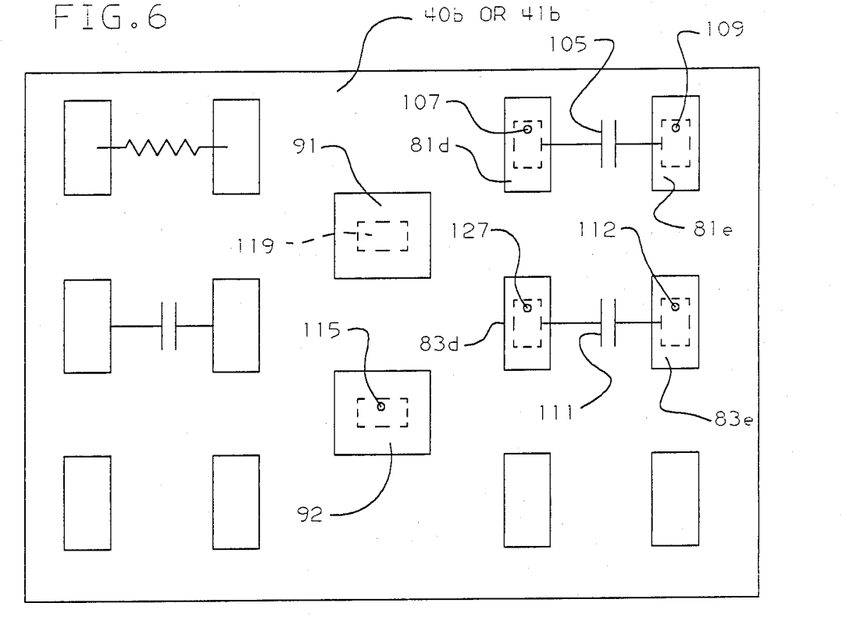
FIG. 6 is a plan view of the outboard surface opposite the one outboard broad surface of FIG. 2.

The multi-layer coupling chips 40 or 41 have contacts 91 and 92 on the broad surfaces 40b or 41b opposite surfaces 40a or 41a (see FIG. 6). These contacts 91 and 92 match the pin extenders 27 and 27 as will be described in more detail in connection with FIGS. 3, 4 and 5. As shown in FIG. 1, wire mesh cylinders or buttons are positioned between the base of the pin extenders 27 and 29 and the contacts 91 and 92 on the surfaces 40b and 41b of multi-layer chips 40 and 41 to provide good electrical contact between the pin extenders 27 and 29 and the contacts 91 and 92 on the multi-layer ceramic coupling chips 40 and 41. A known type is sold as FUZZ BUTTONS by Tecknit of 135 Bryant Avenue, Cranford, New Jersey 07016.

Figure 4:
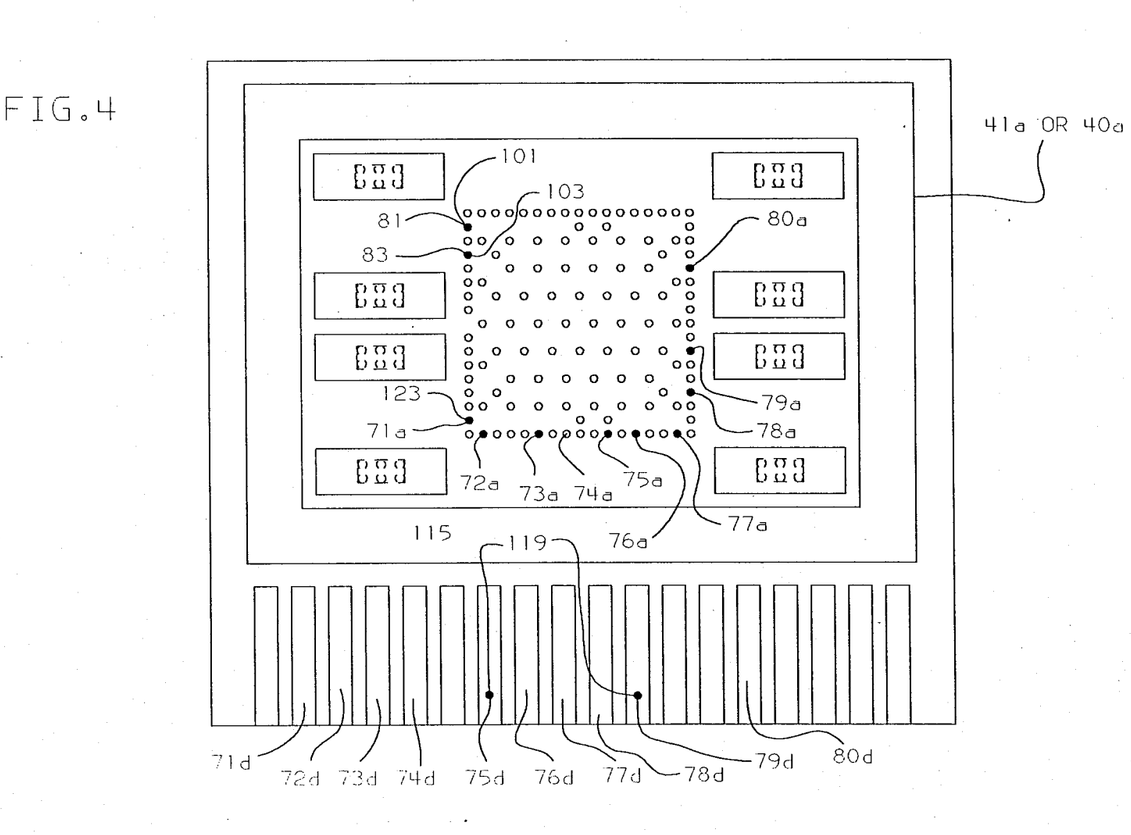
FIG. 4 is a plan view of one outboard broad surface of the coupling chips of FIG. 1.

Referring to FIGS. 4 and 5, there is illustrated surfaces 41a or 40a of multi-layer ceramic coupling chips 40 or 41 that face logic chips 50 or 51. These coupling chips are identical so only one is shown and described. Contact terminals 81 and 83 are the receiver input terminals for chip 41 or the serial output terminals for chip 40 that pass the serial transmission line data signals. These terminals are mounted to contacts 61 and 63 respectively of logic chip 50 or 51. Contacts 71a thru 80a are connected to corresponding contacts 71 thru 80 on the logic chip to provide the parallel output signals from the logic chip to the multi-layer coupling chip 41. Similarly, identically placed contacts on the coupling chip 40 are coupled to like contacts on the logic chip 50. Contact terminals 81 and 83 have conductive feedthroughs that extend through the layers of the coupling chips 40 or 41 with crossover leads at intermediate redistribution layer 40c or 41c of FIG. 5 to the opposite surface 40b or 41b of chips 40 or 41, as shown in FIG. 6 at contact positions 91 and 92. The feedthrough conductor 101 at contact 81 is fed through to terminal 81a at layer 40c or 41c between layers 40a and 40b or 41a and 41b. Similarly, feedthrough conductor 103 at contact 83 is fed through to terminal 83a at inner layer 40c or 41c.

Terminal 81a is coupled to terminal 81b using inner printed circuit lead 81c. Terminal 81b is coupled through layer 40c or 41c using feedthrough conductor 107 to the surface layer 40b or 41b at terminal 81d (FIG. 6). Terminal 81d on surface 40c or 41c is coupled to terminal 81e via a coupling capacitor 105. Terminal 81e is coupled via a feedthrough conductor 109 to terminal 81f on inner surface layer 40c or 41c. The terminal 81f is coupled via circuit lead 108 to terminal 91a and via coupling feedthrough conductor 119 to contacts 91 on surface 40b or 41b. Similarly, terminal 83 is coupled to terminal 83a on layer 40c or 41c and terminal 83a is coupled via lead 83c to terminal 83b. Terminal 83b is coupled through surface 40c or 41c through feedthrough conductor 127 to the layer 40b or 41b at terminal 83d. Terminal 83d on surface 40b or 41b (FIG. 6) is coupled to terminal 83d via a coupling capacitor 111 to terminal 83e. Terminal 83e is coupled via a feedthrough conductor 112 to terminal 83f on inner layer 40c or 41c. The terminal 83f is coupled via printed circuit crossover lead 113 to terminal 92a and via feedthrough conductor 115 to terminal 92 on surface 40b. In this manner the pair of contacts 91 and 92 are fed through the multi-layer coupling structure to the logic chips at terminals 61 and 63.

Figure 7:
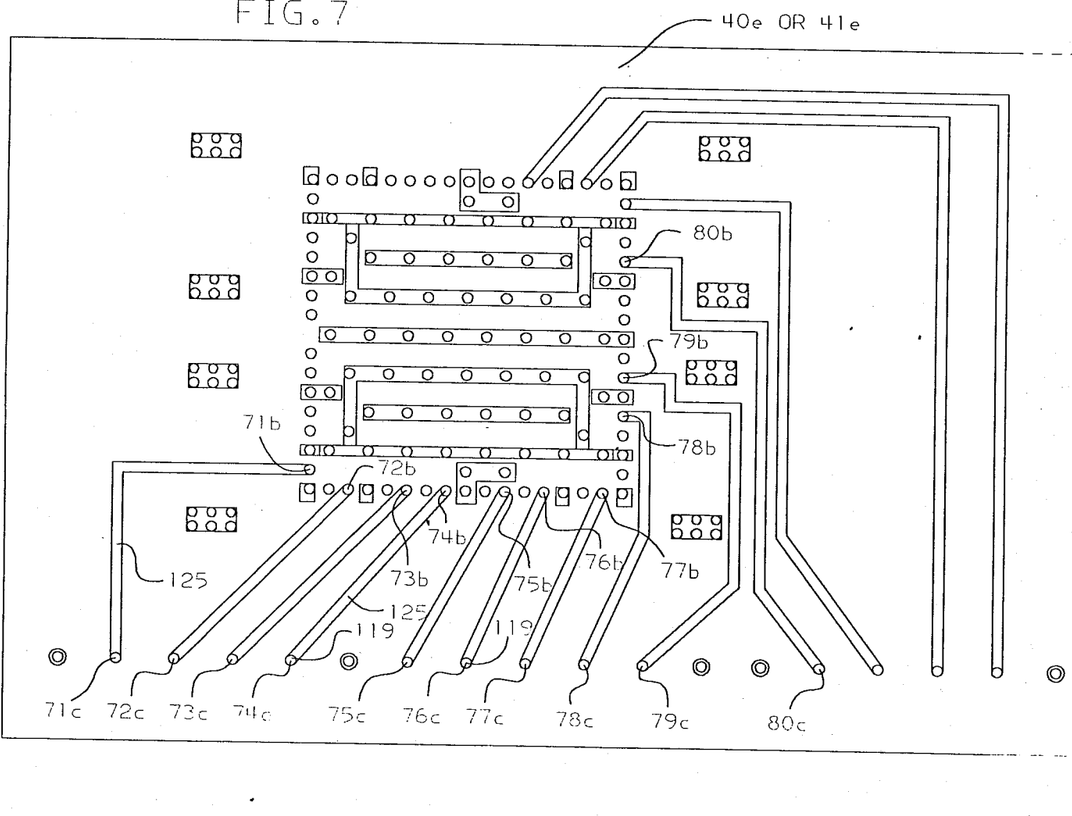
FIG. 7 is a plan view of a second intermediate crossover layer of the coupling chips of FIG. 1.

Referring to FIGS. 3 and 4, the parallel contacts 71-80 on IC logic chip 50 or 51 are connected to corresponding contacts 71a-80a on surface 40a or 41a of multi-layer coupling chip 40 or 41. These contacts 71a-80a are coupled via feedthrough conductors 123 to terminals 71b-80b on a second intermediate substrate layer 40e or 41e, shown in FIG. 7. This layer is preferably adjacent to layer 40a or 41a. These terminals 71b–80b are connected to corresponding terminals 71c–80c near one edge of the chip 40 or 41 via crossover leads 125. These terminals 71c–80c are, in turn, coupled by feedthrough conductors 119 to corresponding contacts 71d–80d on the surface 40a or 41a of FIG. 4. In this manner, the parallel output signals from the chip 41 is applied to the output contacts 71d–80d with very short lead lengths. The thickness of the one layer of the substrate is only 8 mils thick and the entire multi-layer coupling chip is only 100 mils thick. In like manner, the parallel signals from a transmitter source at 71d–80d on surface 40a and are coupled via the intermediate layer 40e to the logic chip via contacts 71a–80a. Other contacts shown but not labeled can be used for test points and providing power supply to the chip in a similar manner. Also, layer could be all conductive except for through holes and insulators to provide Rf shielding.

Figures 8, 9:
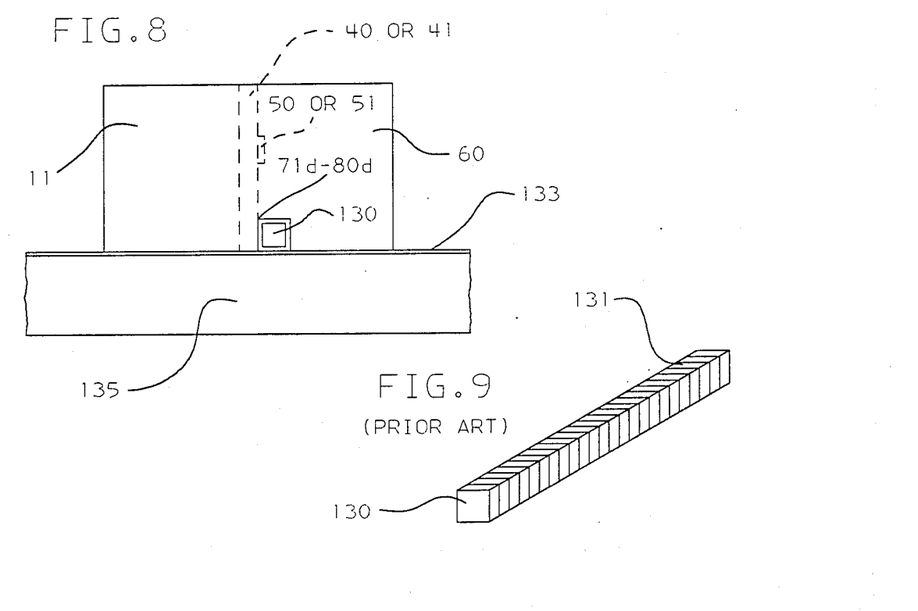
FIG. 8 is a sketch of the transceiver mounted on a pluggable base with elastomeric connector.
FIG. 9 is a sketch of a prior art elastomeric connector.

Referring to FIG. 8, the contact pads 71d–80d on the surface 40a or 41a of chip 40 or 41 extend along near the base substrate 120 to which the transceiver module 10 discussed above is mounted. The base substrate 120 includes conductors 133 on the top surface of a ceramic substrate 125 that match contacts 71d–80d. An elastomeric connector 130 comprising a silicon rubber core with wire rings 131 bonded directly about the core follow rectangular surface around corners (see FIG. 9). The wire ring spacing matches the conductors 123 and contacts 71d–80d and thereby when connector 130 is mounted in the corner between the substrate 135 and the contacts 71d–80d the multi-layer coupling chip 40 or 41 provides interconnection from the logic chip contacts 71–80 chip to the base conductors 133. Elastomeric connector 130 may be, for example, MOE Elastomeric connector from PCK Elastomerics, 2940 Turnpike Drive, Hatboro, Pennsylvania, 19040.

What is claimed is:

1. A transducer assembly for converting from electrical signals to optical signals or optical signals to electrical signals comprising:
   a transducer for converting from electrical signals to optical signals or optical signals to electrical signals having a pair of serial transmission line terminals,
   a logic chip including one of serial to parallel or parallel to serial conversion circuitry with serial terminals and parallel terminals on a same broad surface of said logic chip, and
   a multi-layer coupling chip mounted between said transducer and said logic chip with one broad surface of said coupling chip coupled to said pair of transmission line terminals and with the opposite broad surface coupled to said same broad surface of said logic chip at said serial and parallel terminals, said coupling chip having feedthrough conductor means for connecting the serial transmission line terminals to the corresponding serial terminals on said logic chip through the thickness of the coupling chip and having a plurality of contacts on one surface of said coupling chip for providing parallel coupling to said assembly and
   means coupling said plurality of contacts to said parallel terminals on said logic chip.

2. The combination of claim 1 wherein said plurality of contacts extend along one edge and along a mounting surface of said assembly and including an elastomeric connector mounted along said one edge to provide parallel input or output contacts along the mounting surface of said assembly.

3. The combination of claim 2 including an interposer and wire mesh pads coupled between said transmission line terminals and coupling chip, said interposer including cylindrical sockets adopted to fit tightly over pin terminals at said transmission line terminals, said wire mesh pads press fitted between said sockets and said coupling chip.

4. The combination of claim 1 including a transducer housing adapted to enclose said transducer except at the ends, said housing having the end nearest the transmission line terminals adapted with a recess to receive and align said coupling chip with respect to said transducer.

5. A transducer system for converting electrical signals to optical signals or optical signals to electrical signals comprising in combination:
   a transducer for converting electrical signals to optical signals or optical signals to electrical signals adapted to be coupled to a light transfer medium at one end and a pair of electrical transmission line terminals at the opposite end,
   an integrated circuit logic chip having broad opposite surfaces with a first plurality of contacts on a first broad surface, said first plurality including a first pair of contacts for providing serial connection to said logic chip and a first set of contacts being greater in number than said first pair for providing parallel connection to said logic chip, said logic chip including means coupled between said first set of contacts and said first pair for providing serial to parallel or parallel to serial signal translation with amplification,
   a multilayer coupling chip having opposite broad surfaces with a second pair of contacts on one broad surface and a second set of contacts on the opposite broad surface, said second set of contacts including a third pair of contacts and a third set of contacts equal in number and arrangement to match said first set of contacts on said logic chip, said second set of contacts being arranged to match the first set of contacts and first pair of contacts,
   said multi-layer coupling chip further including a fourth set of contacts near one edge of one of said opposite broad surfaces for connection to external conductors,
   means including coupling layers and vias between said opposite broad surfaces of said multi-layer coupling chip for coupling said second pair of contacts to said third pair of contacts and said third set of contacts to said fourth set of contacts,
   said logic chip being mounted on said coupling chip with said first broad surface on said opposite broad surface of said coupling chip with said first set of contacts and said first pair of contacts connected to said third set of contacts and said third pair of contacts respectively,
   a heat sink adjacent to a broad surface of said logic chip opposite said first broad surface to act as a heat sink therefore, and
   means for coupling said pair of terminals to said second pair of contacts.

6. A combination of claim 5 wherein said fourth set of contacts near said one edge extend along a mounting surface of said assembly and an elastomeric connector is mounted along said one edge to provide parallel output contacts along the mounting surface of said assembly.

7. The combination of claim 6 including an interposer and wire mesh pads coupled between said transmission line terminals of said transducer and said first pair of contacts on said multi-layer coupling chip, said interposer including cylindrical sockets that fit tightly over pins at the transmission line terminals, said wire mesh pads being press fitted between said sockets and said first pair of contracts on said multi-layer coupling chip.

8. The combination of claim 5 including an interposer and wire mesh pads coupled between said transmission line terminals of said transducer and said first pair of contacts on said multi-layer coupling chip, said interposer including cylindrical sockets that fit tightly over pins at the transmission line terminals, said wire mesh pads being press fitted between said sockets and said first pair of contacts on said multi-layer coupling chip.

9. A transducer assembly for converting electrical signals to optical signals or optical signals to electrical signals comprising, in combination:
   a housing for a transducer,
   a transducer for converting electrical signals to optical signals or optical signals to electrical signals mounted in said housing with transducer connector pins extending at one end of said housing,
   a heat sink,
   a logic chip including one of serializing or de-serializing circuitry and amplifiers with serial data contacts and parallel data contacts on a first broad surface of said logic chip, and
   a multi-layer coupling chip having a first broad surface with a first set of serial data contacts adapted to match with said transducer connector pins and said multilayer coupling chip having a second broad surface with a second set of serial data contacts and first parallel data contacts, said multi-layer coupling chip having means for connecting said first set of serial data contacts using vias extending through said chip to said second set of serial data contacts on said second broad surface, said multi-layer coupling chip having one of second parallel input or output contacts on said second broad surface near one edge with parallel interconnection between said first parallel data contacts and said second parallel contacts,
   said logic chips mounted with said first broad surface on said second broad surface of said multi-layer chip with said serial data contacts and said parallel data contacts of said logic chip connected on said second set of serial data contacts and said first parallel data contacts respectively,
   said multi-layer coupling chip and logic chip sandwiched between said housing and said heat sink with said transducer connector pins coupled to said first set of serial data contacts and a broad surface of said logic chip opposite said first broad surface in contact with said heat sink.

10. The combination of claim 9 wherein said one of parallel input or output contacts near said one edge extends along one mounting surface of said assembly and an elastomeric connector mounted between said one edge to provide parallel input or output contacts along the mounting surface of said assembly.

11. The combination of claim 9 including an interposer and wire mesh pads coupled between said transducer connector pins and said first set of serial data contacts,
   said interposer including cylindrical sockets that fit tightly over said pins, said wire mesh pads press being fitted between said sockets and said first set of serial data contacts.

12. A transceiver assembly comprising in combination:
   an optical transmitter subassembly having a set of pins at one end for coupling electrical signals and means adapted to couple to optical fibers at the opposite end,
   a receiver subassembly having means at one end adapted to couple to optical fibers and providing electrical output signals at a pair of pins at the opposite end,
   a housing including a pair of apertures spaced from each other and adapted to receive at one of said apertures the transmitter subassembly and the receiver subassembly in the other spaced apart aperture with said pins extending recessed in an inboard end of said housing,
   a heat sink,
   a first logic chip including serializing circuitry, amplifiers and a clock recovery circuitry with transmitter serial data contacts and transmitter parallel data contacts on a first broad surface of said first logic chip,
   a second logic chip including deserializing circuitry, amplifiers, and clock recovery circuitry with receiver serial data contacts and receiver parallel data contacts on a first broad surface of said second logic chip,
   a first multi-layer coupling chip having a first broad surface with a first set of transmitter serial data contacts adapted to match with said transmitter set of pins and a second broad surface with a second set of transmitter serial data contacts and first transmitter parallel data contacts with said first set of serial data contacts connected using vias through said chip to said second set of serial data contacts, said first multi-layer coupling chip having parallel input contacts on said second broad surface near one edge with parallel interconnects on said coupling chip between said first transmitter parallel data contacts and said parallel input contacts,
   a second multi-layer coupling chip having a first broad surface with a first pair of receiver serial data contacts adapted to match with said receiver pins and a second broad surface with a second pair of receiver serial data contacts and first receiver parallel data contacts with said first pair of receiver serial data contacts connected using vias through said chip to said second pair of receiver serial data contacts, said second multi-layer coupling chip having parallel output contacts on said second broad surface near one edge with parallel interconnects on said coupling chip between said first receiver parallel data contacts and said parallel output contacts,
   said first logic chip mounted with said first broad surface on said second broad surface of said first multi-layer coupling chip with said transmitter serial data contacts and said transmitter parallel data contacts of said logic chip connected on said second set of serial data contacts and said first transmitter parallel data contacts respectively of said first multi-layer chip,
   said second logic chip mounted with said first broad surface on said second broad surface of said second multi-layer coupling chip with said receiver serial data contacts and receiver parallel data contacts of said second logic chip connected on said second pair of receiver serial data contacts and said first receiver parallel contacts respectively of said second multi-layer coupling chip, said first multi-layer coupling chip and logic chip sandwiched between said housing and said heat sink with said transmitter subassembly pins coupled to said first set of transmitter serial data contacts and a broad surface of said logic chip opposite said first broad surface in contact with said heat sink to transfer heat therefrom, said second multi-layer coupling chip and said logic chip sandwiched between said housing and said heat sink with said receiver subassembly pins coupled to said first pair of receiver serial data contacts and a broad surface of said logic chip opposite said first broad surface in contact with said heat sink to transfer heat therefrom.

13. The combination of claim 12 wherein said parallel input contacts near said one edge extends along one mounting surface of said assembly and an elastomeric connector mounted between said one edge to provide parallel outputs along the mounting surface of said assembly, and wherein said parallel output contacts near said one edge extends along one mounting surface of said assembly and a second elastomeric connector mounted between said one edge to provide parallel output contacts along the mounting surface of said assembly.

14. The combination of claim 13 including a first interposer and wire mesh pads coupled between said transmitter subassembly connector pins and said first set of transmitter serial data contacts, said first interposing including cylindrical sockets that fit snuggly over said pins, said wire mesh pads being press fitted between said socket and said first set of transmitter serial data contacts, and a second interposer and second set of wire mesh pads coupled between said receiver connector pins and said first set of receiver serial data contacts, said second interposer including cylindrical sockets that fit snuggly over said pins, said wire mesh pads fitted between said sockets and said first set of receiver serial data contacts.

* * * * *